United States Patent [19]

Tullis et al.

[11] Patent Number: 4,872,835
[45] Date of Patent: Oct. 10, 1989

[54] HOT CHUCK ASSEMBLY FOR INTEGRATED CIRCUIT WAFERS

[75] Inventors: Barclay J. Tullis, Palo Alto; Richard G. Baer, Los Altos Hills, both of Calif.

[73] Assignee: Hewlett-Packard Company, Palo Alto, Calif.

[21] Appl. No.: 889,548

[22] Filed: Jul. 24, 1986

[51] Int. Cl.⁴ .............................................. F24J 3/00
[52] U.S. Cl. .................................... 432/225; 219/460; 34/145; 34/92
[58] Field of Search .................. 432/205, 225, 220; 219/443, 460; 34/145, 92

[56] References Cited

U.S. PATENT DOCUMENTS

| | | | |
|---|---|---|---|
| 3,064,363 | 11/1962 | Ikeachi | 34/145 |
| 3,889,389 | 6/1975 | Serup | 34/92 |
| 4,020,563 | 5/1977 | Hoefer | 34/92 |
| 4,415,788 | 11/1983 | Field | 219/460 |
| 4,518,848 | 5/1985 | Weber | 432/122 |
| 4,549,052 | 10/1985 | Simon | 219/460 |
| 4,556,785 | 12/1985 | Blechschmid et al. | 219/460 |

Primary Examiner—Henry C. Yuen

[57] ABSTRACT

A hot chuck assembly characterized by a platen suspended over a base assembly by four, equally spaced mounting assemblies. The suspension points on the platen are provided as close as possible to its upper, wafer support surface so that thermal expansion of the platen has a minimal effect on the position of a supported wafer. Each of the mounting post assemblies includes a pair of resilient leg portions which can flex in a radial direction to absorb radial expansion or contraction of the platen. In consequence, the hot chuck assembly of the present invention minimizes both lateral and axial displacement of a supported integrated circuit wafer as the platen heats and cools.

22 Claims, 3 Drawing Sheets

HOT CHUCK ASSEMBLY FOR INTEGRATED CIRCUIT WAFERS

DESCRIPTION OF THE PRIOR ART

1. Field of he Invention

This invention relates generally to integrated circuit testing apparatus, and more particularly to apparatus used to test the die of integrated circuit wafers before they have been cut into individual integrated circuit chips 2 Description of the Prior Art A first step in the production of an integrated circuit device is the manufacture of an integrated circuit wafer comprised of many individual integrated circuit die. Usually, each die will be tested to see if it is functional before the wafer is cut to separate the die into integrated circuit chips. If, during the testing process, it is determined that a particular die is inoperative, it can be marked by the testing machine to distinguish it from the functional die. After the entire wafer has been tested and the non-functional die have been marked, the wafer is sawn or cut to separate the die into the individual chips. The marked chips are discarded and the good chips are packaged to complete the manufacture of the integrated circuit devices.

Enlarged, conductive contact pads are produced in the upper surface of each die to serve initially as test pads, and later as bonding pads. Probes of a wafer testing machine are placed in contact with these pads to permit the testing machine to perform a number of electric and electronic tests on the die.

It is often desirable to test the integrated circuit wafer at elevated temperatures. For this purpose, "hot chucks" have been developed. A hot chuck generally includes a platen for supporting an integrated circuit wafer, a mechanism for heating the platen to a desired temperature, and a mechanism for securing an integrated circuit wafer to the platen. Prior art hot chucks are rigidly attached to a base plate, which, in turn, can be attached to a mounting plate of an X-Y stage.

Feature sizes, i.e. line widths, pad areas etc., are becoming ever smaller in order to increase the density, performance, and complexity of integrated circuit devices. In consequence, it is becoming continually more difficult to properly position the test probes of an integrated circuit wafer testing machine on the test pads of an integrated circuit die.

The aforementioned problem is particularly apparent with hot chuck assemblies of the prior art. More specifically, it has been found that when a prior art hot chuck assembly is heated to approximately 300 degrees Centigrade, the chuck platen which supports the integrated circuit wafer expands both axially and radially. The axial expansion, which can be as much as 0.007 inches, is particularly disruptive, because it will often cause the test probes of the wafer testing machine to slide off of the test pads with which they were in contact. The radial expansion of the chuck platen can also be problematic if it causes a lateral shift of the chuck platen, again potentially causing the test probes of the wafer testing machine to slide off of their respective test pads.

SUMMARY OF THE INVENTION

A major object of this invention is to provide a hot chuck assembly which can support an integrated circuit wafer in a substantially constant horizontal plane as it is heated and cooled.

Briefly, the invention includes a base assembly which can attach to an X-Y stage table, a chuck assembly, and a plurality of mounting assemblies which support the chuck assembly over the base assembly. The chuck assembly includes a chuck platen having a substantially horizontal, planar, wafer support surface, a heating coil for selectively heating the chuck platen, and a vacuum clamping mechanism for holding an integrated circuit wafer firmly against the wafer support surface. The mounting assemblies each include a radially flexible mounting post attached to the base portion and a mounting pin cantilevered from a top portion of the mounting post to engage the chuck platen near its wafer support surface.

As the chuck platen is heated, its axial expansion is almost entirely in a downward direction because the mounting pins support the platen almost at the wafer support surface. In consequence, there is minimal axial movement of the wafer support surface as the platen is heated or cooled, which maintains the integrated circuit wafer in a substantially constant horizontal plane.

Radial expansion of the chuck platen is transmitted through the mounting pins to the mounting posts. The legs of the mounting posts are designed to flex in a radial direction in such a manner so as to maintain the vertical position of the wafer support surface, and to inhibit lateral movement of the central axis of the chuck platen. Small, axial movements caused by deflections of the mounting assemblies tend to offset small, residual axial displacements of the wafer and platen.

An advantage of this invention is that an integrated circuit wafer can be heated and allowed to cool without causing the test probes of a wafer testing machine from slipping or lifting off of the test pads of an integrated circuit die.

These and other objects and advantages of the present invention will no doubt become apparent to those skilled in the art after they have read the following descriptions and studied the various figures of the drawing.

DETAILED DESCRIPTION OF THE PREFERRED EMBODIMENTS

Figure 1:
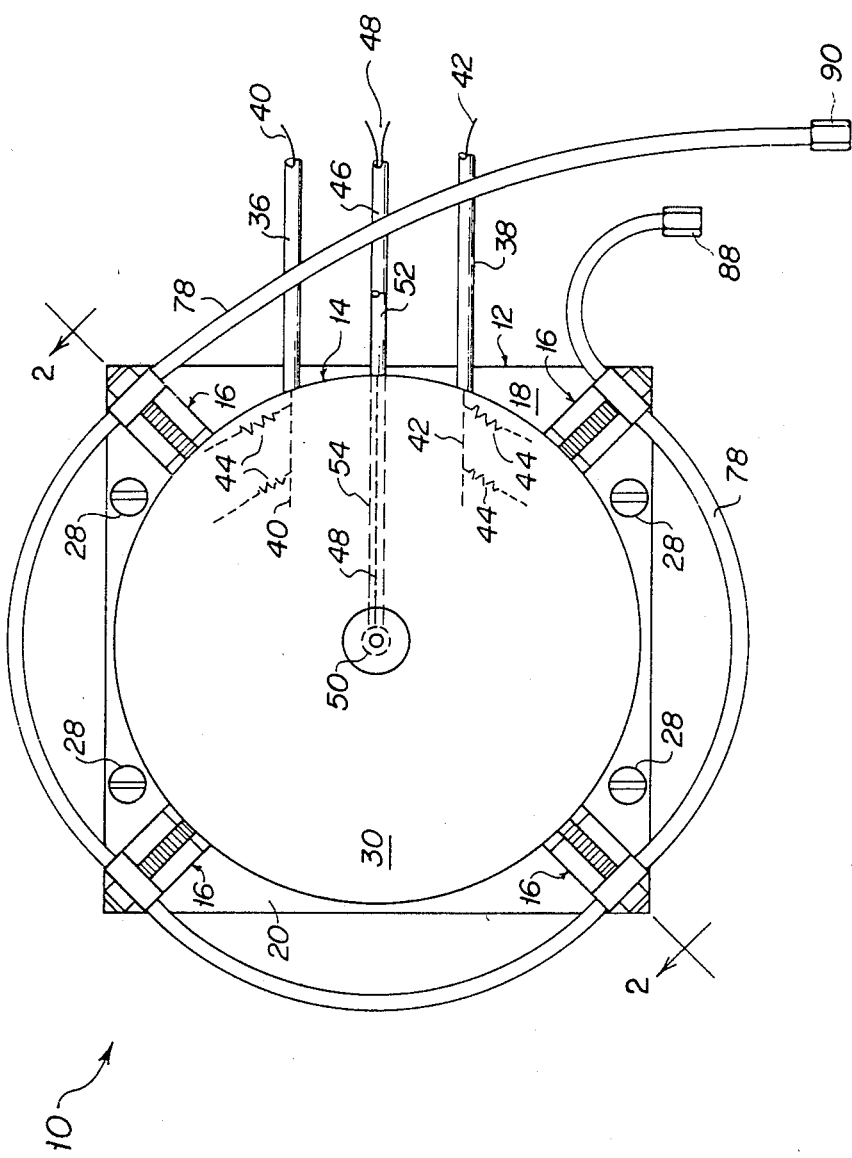
FIG. 1 is a top plan view of a hot chuck assembly in accordance with the present invention.
Figure 2:
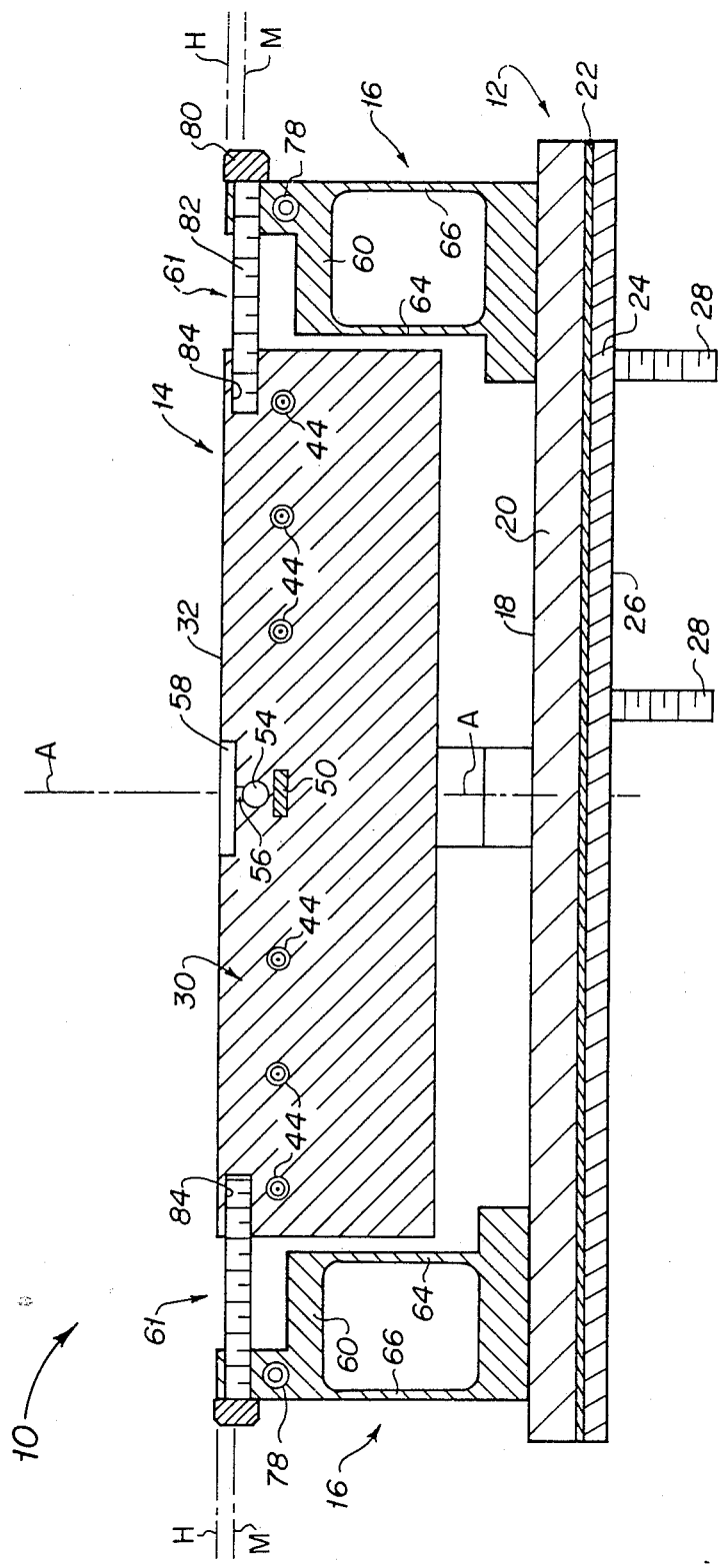
FIG. 2 is a cross-sectional view taken along line 2—2 of FIG. 1.

With reference to FIGS. 1 and 2, a hot chuck assembly 10 in accordance with the present invention includes a base assembly 12, a platen assembly 14, and a number of mounting assemblies 16. As best seen in FIG. 2, the mounting assemblies 16 support the platen assembly 14 above the upper surface 18 of the base assembly 12.

Base assembly 12 includes a mounting plate 20, an insulating spacer 22, and an interface plate 24. The insulating spacer 22 is sandwiched between mounting plate 20 and interface plate 24 to electrically insulate the mounting plate 20 from the interface plate 24. A bottom surface 26 of interface plate 24 is configured to engage a mounting surface of an X-Y stage table (not shown). The base assembly 12 is coupled to the mounting surface of the X-Y stage table by a number of bolts 28.

Platen assembly 14 includes a platen 30 having a substantially horizontal, planar, wafer support surface 32. A pair of conduits 36 and 38 are attached to openings in the side of platen 30 and provide support for insulated wires 40 and 42. The insulated wires 40 and 42 are coupled to resistance coils 44 which are concentrically positioned within the platen 30. When wires 40 and 42 are coupled to an electrical power source, current flows through the resistance coils embedded within platen 30 to heat the platen.

A conduit 46 is attached to an opening in platen 30 and encloses an insulated wire pair 48 which are connected to a thermocouple 50. When the wires 48 are coupled to inputs of a feedback control circuit (not shown), the feedback control circuit can regulate the amount of current flowing through wires 40 and 42 and resistance coil 44, thereby maintaining the temperature of the platen 30 at a desired level.

As seen in FIG. 1, a vacuum conduit 52 is located directly over conduit 46 and is coupled to a vacuum channel 54. The vacuum channel 54 is coupled by a short, vertical channel 56 to a circular vacuum groove 58 cut into the wafer support surface 32. When vacuum conduit 52 is coupled to a vacuum pump or other vacuum source, a suction is created at circular groove 58. If an integrated circuit wafer is placed upon wafer support surface 32, it will be firmly held against this wafer support surface by the vacuum suction.

Figure 3:
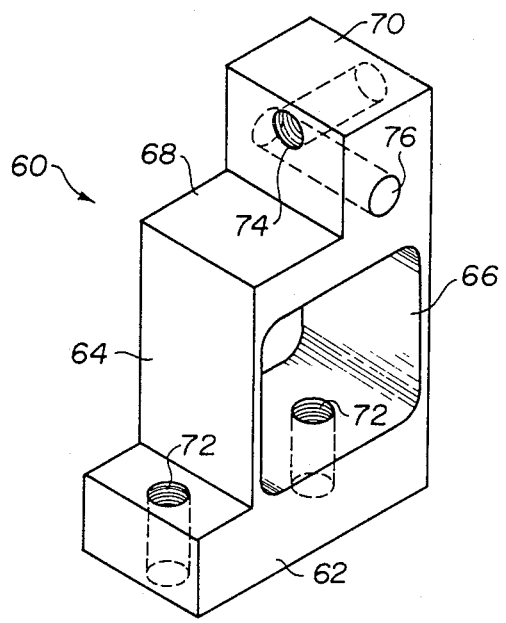
FIG. 3 is a perspective view of the mounting posts shown in FIGS. 1 and 2.

With continuing reference to FIGS. 1 and 2 and additional reference to FIG. 3, the mounting assembly 16 includes a mounting post 60 and a mounting pin 61. The length of pin 61 and the height of mounting post 60 are of comparable magnitude.

Mounting post 60 includes a foot portion 62, a pair of leg portions 64 and 66, a shoulder portion 68, and a head portion 70. Foot portion 62 is provided with a pair of threaded bores 72, which permit a mounting post 60 to be attached to mounting plate 20 of the base assembly 12 by a suitable pair of machine bolts (not shown). Head portion 70 is provided with a threaded bore 74 receptive to the mounting pin 61. Head portion 70 is also provided with a bore 76 which is receptive to a cooling conduit 78.

Mounting pin 61 is, in this preferred embodiment, a stainless steel machine bolt having a head 80 and a threaded shank 82. The threaded shank 82 engages the threaded bore 74 of mounting post 60, and also engages threaded bores 84 provided in platen 30. Pins 61 are cantilevered from the head portion 70 of mounting post 60 to suspend platen 30 above the upper surface 18 of base assembly 12.

Referring now primarily to FIG. 2, the platen 30 has a central axis A, and the wafer support surface 32 lies along a substantially horizontal plane H. The mounting pins 61 each have a central axis M which is substantially parallel to horizontal plane H and perpendicular to central axis A.

As mentioned previously, a major object of this invention is to prevent any shift in the central axis A and/or any movement of the horizontal plane H as platen 30 is heated or allowed to cool. To minimize the movement of the horizontal plane H of the wafer support surface 32, the mounting pin axis M should be as close to the horizontal plane H as possible. This can, of course, be accomplished by providing the threaded bores 84 in the platen 30 as close to the wafer support surface as possible, and also by making the diameter of the mounting pin 61 as small as possible. By supporting the platen 30 near the wafer support surface 32, there is very little platen material above the mounting pins to expand or contract. Except for a small residual axial expansion of the materials of platen 30 which are located above the mounting pins 61, virtually all of the axial expansion and contraction of the platen will occur below the mounting pin axis M, i.e., towards or away from the base assembly 12. The residual axial expansion of platen 30 and any axial expansion of an integrated circuit wafer supported by platen 30 are partially compensated by small, axial movements of the mounting assemblies.

Figure 4:
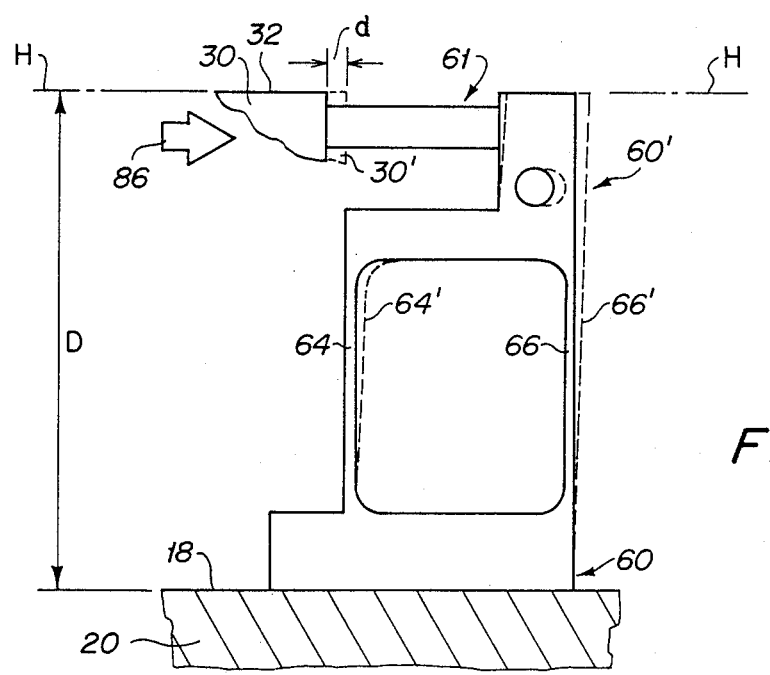
FIG. 4 is an elevation view of the mounting posts and mounting pins shown in FIGS. 1 and 2 as they absorb radial expansion of the chuck platen.

Referring now to FIG. 4, the platen 30, when heated, will also expand in a radial direction as indicated by arrow 86 As the platen 30 expands a distance "d", the legs 64 and 66 of the mounting post 60 will flex as indicated at 64' and 66'. Since the height of the mounting post 60 is large compared to the small deflection d caused by radial expansion of platen 30, the distance "D" between wafer support surface 32 and upper surface 18 remains relatively constant, thus maintaining the wafer support surface in the horizontal plane H.

Furthermore, the symmetrical arrangement of the mounting posts 60 around the platen 30 helps maintain the lateral position of axis A of the platen 30. This is due to the fact that the spring biasing force of the resilient leg portions 64 and 66 will tend to be equalized among the various mounting posts.

The flexible leg portions 64 and 66 are mutually parallel and are aligned in the direction of radial expansion 86. Of course, more or fewer leg portions could also accomplish the same result. However, if at least two, mutually parallel, resilient leg portions are provided for each mounting post, torsional effects exerted on the mounting pins 61 will be minimized.

The platen 30 and mounting posts 60 are preferably made from materials having high thermal conductivity, such as brass. The mounting pins 61, on the other hand, are made from a material having relatively lower thermal conductivity, such as stainless steel. By using a low thermal conductivity material of small cross sectional area for the mounting pins 61 and a high thermal conductivity material for the platen 30 and mounting posts 60, and by making the mounting pins 61 relatively long, a sharp temperature gradient is formed along the shank 82 which results in relatively little heat being transmitted from the platen 30 to the mounting post 60. In fact, the combination of these factors have been shown to keep the temperature of the mounting posts 60 near ambient temperatures even when the plate 30 is heated to 300 degrees centigrade.

Heat that is transmitted to the mounting post 60 can be dissipated by conduction via cooling conduit 78 which is plumbed through the bores 76 of head portion 70 of the mounting post 60. As seen in FIG. 1, the cooling conduit 78 is provided with fittings 88 and 90, one of which is attached to a source of cooling fluid, and the other of which is attached to a drain for cooling fluid.

While this invention has been described with reference to a single preferred embodiment, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A hot chuck assembly comprising:
   base means;
   chuck means including:
      a platen having a substantially horizontal, planar, wafer support surface; and
      heater means for heating said platen; and
   support means supporting said chuck over said base means such that said wafer support surface remains in a substantially constant horizontal plane, said support means including a plurality of mounting assemblies coupled to said base means and supporting said chuck means over said base means, where each of said mounting assemblies includes:
      a substantially horizontal mounting pin coupled to said chuck means proximate and substantially parallel to said wafer support surface; and
      a mounting post attached to said base means and adapted to radially flex relative to said wafer support surface, said mounting post including a foot portion attached to said base means, a head portion couples to said mounting pin, and flexible leg means coupling said foot portion to said head portion, said flexible leg means including a plurality of flexible leg portions which are aligned in the direction of said radial flexure; and
   means for cooling said head portion of said mounting post means including conduit means contacting said head portion of said mounting post means, and a fluid coolant circulated through said conduit means.

2. A hot chuck assembly comprising:
   base means;
   chuck means including:
      a platen having a top, substantially horizontal, planar, wafer support surface and an opposing bottom surface; and
      heater means for heating said platen; and
   support means coupled to said platen proximate to said support surface and distal from said bottom surface, said support means being adapted to support said chuck means over said base means such that said wafer support surface remains in a substantially constant horizontal plane regardless of the temperature of said platen.

3. A hot chuck assembly as recited in claim 1 wherein said support means includes a plurality of mounting assemblies coupled to said base means and supporting said chuck means over said base means.

4. A hot chuck assembly as recited in claim 3 wherein each of said mounting assemblies include mounting post means attached to said base means, and substantially horizontal mounting pin means extending between said mounting post means and said chuck means.

5. A hot chuck assembly as recited in claim 4 wherein said mounting pin means are coupled to said chuck means proximate and substantially parallel to said wafer support surface.

6. A hot chuck assembly as recited in claim 5 wherein said mounting post means are capable of radial flexure relative to said wafer support surface.

7. A hot chuck assembly as recited in claim 6 wherein said mounting post means includes a foot portion attached to said base means, a head portion coupled to said mounting pin means, and flexible leg means coupling said bottom portion to said top portion.

8. A hot chuck assembly as recited in claim 7 wherein said flexible leg means includes a plurality of flexible leg portions which are aligned in the direction of said radial flexure.

9. A hot chuck assembly as recited in claim 8 further comprising means for cooling said head portion of said mounting post means.

10. A hot chuck assembly as recited in claim 5 wherein said mounting pin means has a lower thermal conductivity than the thermal conductivity of said platen and the thermal conductivity of said mounting post means.

11. A hot chuck assembly as recited in claim 10 wherein said mounting pin means comprises a threaded shank, and wherein said platen is provided with a threaded bore that can be engaged with said threaded shank.

12. A hot chuck assembly as recited in claim 1 wherein said chuck means is provided with vacuum channel means opening on said wafer support surface, and vacuum coupling means adapted to couple said vacuum channel means to a vacuum source.

13. A hot chuck assembly comprising:
    base means having opposing lower and upper surfaces, where said lower surface of said base means is adapted for attachment to an X-Y stage table;
    chuck means including a platen having a substantially horizontal, planar, wafer support surface; heating means for selectively heating said platen; and wafer holding means adapted to selectively hold a wafer against said wafer support surface; and
    a plurality of mounting assemblies attached to said base means and supporting said chuck means above said upper surface of said base means; where each of said mounting assemblies include mounting post means capable of radial flexure relative said wafer support surface, and mounting pin means coupled at a first end to said mounting post means and coupled at a second end to said platen; whereby vertical movement of said wafer support surface is minimized as said chuck means changes temperature so that said wafer support remains in a substantially constant horizontal plane.

14. A hot chuck assembly as recited in claim 13 wherein said base means includes a table interface plate adapted for attachment to said X-Y table; a mounting post plate adapted for attachment to said mounting post means; and an insulating spacer plate sandwiched between said table interface plate and said mounting post plate.

15. A hot chuck assembly as recited in claim 13 wherein each of said mounting post means include a plurality of flexible leg portions that are mutually parallel and which are aligned in the direction of said radial flexure.

16. A hot chuck assembly as recited in claim 13 wherein said heating means includes resistance means adapted to heat said platen; and means for electrically energizing said resistance means.

17. A hot chuck assembly as recited in claim 13 wherein said wafer holding means includes a vacuum channel provided in said platen and opening on said wafer support surface; and means for applying a vacuum to said vacuum channel.

18. A hot chuck assembly as recited in claim 13 wherein said chuck means further includes temperature sensing means for determining the temperature of said platen.

19. A hot chuck assembly as recited in claim 13 wherein each of said mounting post means includes flexible leg means capable of said radial flexure.

20. A hot chuck assembly as recited in claim 19 wherein said flexible leg means includes a plurality of flexible leg portions aligned in the direction of said radial flexure.

21. A hot chuck assembly as recited in claim 13 wherein said mounting pin means is substantially parallel to said wafer support surface and is attached to said platen proximate to said wafer support surface.

22. A hot chuck assembly as recited in claim 13 wherein said mounting pins means has a lower thermal conductivity than the thermal conductivity of said platen and the thermal conductivity of said mounting post means.

* * * * *

UNITED STATES PATENT AND TRADEMARK OFFICE
CERTIFICATE OF CORRECTION

PATENT NO. : 4,872,835

DATED : Oct. 10, 1989

INVENTOR(S) : Barclay J. Tullis; Richard G. Baer

It is certified that error appears in the above-identified patent and that said Letters Patent is hereby corrected as shown below:

Column 4, line 19 "86 As the" should read -- 86. As the --

Column 5, line 10, "chuck over" should read -- chuck means over --

Signed and Sealed this

Thirtieth Day of April, 1991

Attest:

HARRY F. MANBECK, JR.

Attesting Officer

Commissioner of Patents and Trademarks